US010553503B2

(12) United States Patent
Davis et al.

(10) Patent No.: US 10,553,503 B2
(45) Date of Patent: Feb. 4, 2020

(54) METHOD AND STRUCTURE FOR FLIP-CHIP PACKAGE RELIABILITY MONITORING USING CAPACITIVE SENSORS GROUPS

(71) Applicant: International Business Machines Corporation, Armonk, NY (US)

(72) Inventors: Taryn J. Davis, Beacon, NY (US); Jonathan R. Fry, Fishkill, NY (US); Tuhin Sinha, Oradell, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/722,459

(22) Filed: Oct. 2, 2017

(65) Prior Publication Data
US 2018/0047644 A1    Feb. 15, 2018

Related U.S. Application Data

(62) Division of application No. 14/962,614, filed on Dec. 8, 2015, now Pat. No. 9,818,655.

(51) Int. Cl.
| H01L 21/66 | (2006.01) |
| H01L 23/522 | (2006.01) |
| H01L 21/48 | (2006.01) |
| H01L 21/54 | (2006.01) |
| G01R 31/28 | (2006.01) |
| H01L 21/56 | (2006.01) |

(52) U.S. Cl.
CPC .......... *H01L 22/14* (2013.01); *G01R 31/2853* (2013.01); *H01L 21/4853* (2013.01); *H01L 21/54* (2013.01); *H01L 23/5222* (2013.01)

(58) Field of Classification Search
None
See application file for complete search history.

(56) References Cited

U.S. PATENT DOCUMENTS

| 6,094,144 | A | 7/2000 | Dishongh et al. |
| 6,140,144 | A | 10/2000 | Najafi et al. |
| 6,366,209 | B2 | 4/2002 | Dishongh et al. |
| 6,384,610 | B1 | 5/2002 | Wilson |
| 6,452,502 | B1 | 9/2002 | Dishongh et al. |
| 6,476,632 | B1 | 11/2002 | La Rosa et al. |
| 6,590,409 | B1 | 7/2003 | Hsiung et al. |
| 6,800,946 | B2 | 10/2004 | Chason et al. |
| 7,394,273 | B2 | 7/2008 | Hsu et al. |
| 7,741,834 | B2 | 6/2010 | Dang et al. |

(Continued)

FOREIGN PATENT DOCUMENTS

JP    2001284198 A    10/2001

OTHER PUBLICATIONS

List of IBM Patents or Patent Applications Treated as Related, U.S. Appl. No. 15/722,459, filed Oct. 2, 2017, 2 Pages.

(Continued)

*Primary Examiner* — Moazzam Hossain
*Assistant Examiner* — Stanetta D Isaac
(74) *Attorney, Agent, or Firm* — Cantor Colburn LLP; Alvin Borromeo

(57) ABSTRACT

Flip-chip package reliability monitoring and systems of monitoring using capacitive sensors are disclosed. The monitoring is conducted in situ and in real-time without the need for destructive testing of the packages. The capacitive sensors can be used for flip-chip package reliability monitoring.

9 Claims, 8 Drawing Sheets

(56) References Cited

U.S. PATENT DOCUMENTS

| | | |
|---|---|---|
| 8,095,907 B2 | 1/2012 | Bickford et al. |
| 8,803,145 B2 | 8/2014 | Patti et al. |
| 9,818,655 B2 | 11/2017 | Davis et al. |
| 2003/0151047 A1 | 8/2003 | Corbett et al. |
| 2009/0201626 A1 | 8/2009 | Ayotte et al. |
| 2010/0203655 A1 | 8/2010 | Ayotte et al. |
| 2013/0009663 A1 | 1/2013 | Gauch et al. |
| 2013/0240884 A1 | 9/2013 | Barth et al. |
| 2015/0184237 A1 | 7/2015 | Su et al. |
| 2016/0155712 A1 | 6/2016 | Gietler et al. |
| 2017/0162455 A1 | 6/2017 | Davis et al. |

OTHER PUBLICATIONS

Taryn J. Davis, et al., "Method and Structure for Flip-Chip Package Reliability Monitoring Using Capactive Sensors Groups," U.S. Appl. No. 15/722,547, filed Oct. 2, 2017.

Yin, X. et al, "Non-destructive evaluation of concrete using a capacitive imaging technique: Preliminary modelling and experiments", Cement and Concrete Research, 2010, pp. 1734-1743, vol. 40.

METHOD AND STRUCTURE FOR FLIP-CHIP PACKAGE RELIABILITY MONITORING USING CAPACITIVE SENSORS GROUPS

This application is a divisional of U.S. application Ser. No. 14/962,614, titled "METHOD AND STRUCTURE FOR FLIP-CHIP PACKAGE RELIABILITY MONITORING USING CAPACITIVE SENSORS GROUPS" filed Dec. 8, 2015, the entire contents of which are incorporated herein by reference.

BACKGROUND

The present invention generally relates to chip package reliability monitoring and systems of monitoring, and more particularly to the use of capacitive sensors for 2D, 2.5D, and 3D flip-chip package reliability monitoring.

Flip-chip technology includes methods for interconnecting semiconductor devices, such as integrated circuit (IC) chips to external circuitry using solder bumps that have been deposited onto chip pads. The solder bumps are deposited on the chip pads on a top side of a wafer to mount the chip to external circuitry (e.g., a circuit board or another chip or wafer). The wafer is flipped over so that its top side faces down, and aligned so that its pads align with matching pads on the external circuit, and then the solder is flowed to complete the interconnect. This technique is in contrast to wire bonding, in which the chip is mounted upright, and wires are used to interconnect the chip pads to external circuitry.

In 2D flip-chip packages, chips or die are interconnected on a substrate using flip-chip interconnects and the chips or die are in a side-by-side orientation, i.e. mounted on a single plane. In 3D chip stacks, chips or die are layered on top of one another in a three-dimensional stack with electrical interconnects between layers. This configuration has many benefits, such as providing a designer with the ability to place an increased number of chips in a given two-dimensional area with an increased amount of electrical communications between them. In 2.5D packages, an interconnect substrate known as an interposer is used to provide high density interconnects. The interposer is placed between the substrate and the die, where the interposer has through-silicon vias (TSVs) connecting the metallization layers on its upper and lower surfaces.

Interconnection mechanical failures are a common occurrence within 2D, 2.5D and 3D flip-chip packages. The complex composite (layered/mixed) structure of the packages and associated mismatch in mechanical properties of the various zones, especially coefficient of thermal expansion (CTE), often induce a variety of mechanical failures. One such type of failure is observed at the solder interconnections of Controlled Collapse Chip Connection (C4), where the CTE mismatch between the silicon die and the carrier (e.g. an organic substrate or interposer) leads to failure in those joints. One of the biggest challenges in microelectronics flip-chip packaging is managing/mitigating the chip-packaging interaction (CPI) stresses that occur due to the CTE mismatches. The CTE mismatch between the chip and substrate/interposer creates increased mechanical stress that is highest in the chip corners. CTE mismatch can also drive considerable warpage in the package, which drives mechanical stress on the interconnections and interfill between multiple chips in stacked die, or die on interposers. One method to increase the solder joint life is by encapsulation with underfill, however it does not completely eliminate the possibility of an electrical connection breakage. The underfill is also subject to the high mechanical stresses in the package, and may lead to the development of bulk and interfacial cracks, which propagate into solder interconnections causing failure.

In order to determine the field condition life-cycle for a specific package, strict accelerated reliability testing must be performed. Existing reliability failure analysis techniques are time intensive and costly. Current chip crack propagation confirmation techniques include confocal mode scanning acoustic microscopy (C-SAM), electrical readout and hand probing of C4 nets, and destructive physical failure analysis by cross sectioning the module. Due to the nature of the failure, extensive physical damage to the module and interconnects must be present before C4 net resistance increases to the desired failure criteria and can be detected in the reliability analysis. All three of the above described analysis methods do not provide early failure detection, and do not provide information needed to fully understand the impact of package design on module failure modes and rates. Furthermore, physical failure analysis can find a fail or defect, but not necessarily the defect of interest or the causal defect, because there can be more than one. In addition, these failure and reliability analysis processes are time consuming. Because the route of verifying the fails and root cause physical analysis is lengthy, only a few parts are put through the entire process, thereby limiting the amount of data collected.

There remains a need in the art for a method and system to understand failure progression and sequence in order to develop strategies for stress mitigation and stress design in 2D, 2.5D, and 3D flip-chip packages.

SUMMARY

In one embodiment, a method comprises providing a flip-chip package comprising at least one capacitive sensor that measures capacitance over time; monitoring for and reporting a change in capacitance over time using the at least one capacitive sensor, wherein the change in capacitance is due to a chip-packaging interaction failure; and creating a sequential inventory of non-critical failures which can be used to create a reliability assessment or diagnostic for the flip-chip package.

In another embodiment, a method comprises providing a flip-chip package comprising at least one capacitive sensor that measures capacitance over time; monitoring for a change in capacitance over time from time zero to a time of a first change in capacitance, and sending an electrical signal at the time of the first change in capacitance (SN1); optionally monitoring for a change in capacitance from the time of the first change in capacitance to a time of a second change in capacitance, and sending an electrical signal at the time of the second change in capacitance (SN2); optionally continue monitoring and sending an electrical signal at a time of each subsequent change in capacitance (SNx) until final failure of the package, and sending an electrical signal for the final failure (SF); wherein the electrical signals returning from the at least one capacitive sensors from time zero (S0) to final failure (SF), with intermediate signals (SN1, SN2, SNx) representing noncritical failures, are S0→SN1→SN2→SNx→SF where S0≠SNx≠SF; and creating a sequential inventory of non-critical failures which can be used to create a reliability assessment or diagnostic for the flip-chip package; wherein the change in capacitance over time is due to a chip-packaging interaction failure that is crack formation and propagation in the flip-chip package underfill, interfill, solder mask, chip, substrate, interposer, or a combination thereof, delamination of a component of the flip-chip package, warping of the flip-chip package, a combination thereof.

In another embodiment, a monitoring apparatus comprises at least one capacitive sensor located in a flip-chip package, wherein the monitoring apparatus can sense and report a chip-packaging interaction failure.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
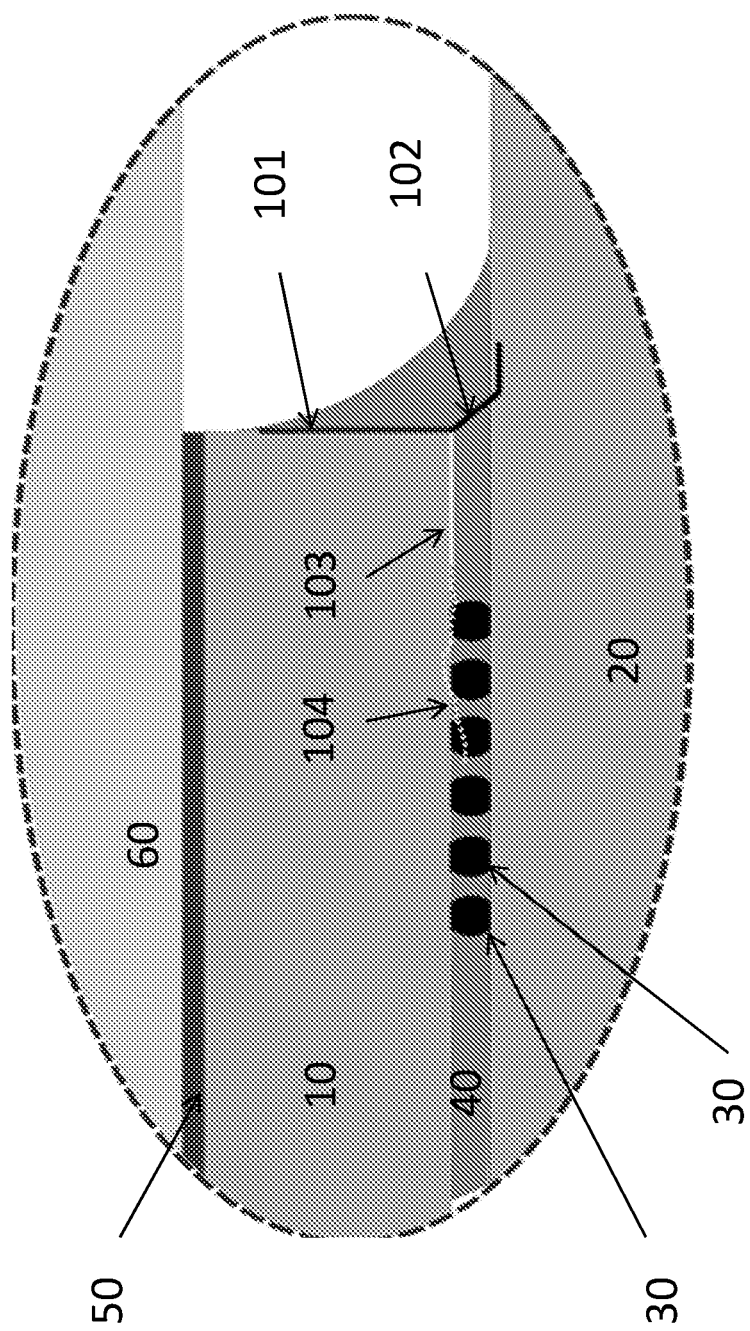
FIG. 1 is a schematic of a close up, side view of a portion of a 2D flip-chip package showing exemplary primary crack propagation routes.

As stated above, the present invention relates to chip packaging reliability monitoring methods and on-board systems of monitoring, and more particularly to the use of capacitive sensors for 2D, 2.5D, or 3D flip-chip package reliability monitoring. The instant monitoring method and system allows for the evaluation of all design components of a chip package in situ and in real-time without the need for destructive testing. The system and method have "first cause" capability all the way through to catastrophic failure and detection of every change in between. Thus, there is the real-time tracking and diagnosis of crack propagation and failure of the chip package.

Capacitive sensors, either as individual, groups, or arrays of capacitor pairs, are placed in and around stressed areas of the chip package, for example those areas under the highest mechanical stress caused by CTE mismatch (chip underfill/interfill in chip/interposer regions, particularly corner regions). The capacitive sensors can detect a change in capacitance due to the presence of a mechanical flaw (e.g. a crack or air gap) or a change in geometry of the capacitor plates of the sensor. The capacitive sensors not only monitor for early failures, but provide information to understand the primary failure cause, rate, propagation, and severity of cracking in real-time with non-destructive high resolution.

The instant system and method provides resolution in the location and rate at which cracks propagate in a chip assembly ultimately causing module failure. The system and method also provide much earlier crack detection than the current investigative methods. This information can be collected much more rapidly, and because the invention provides timely analysis, every part of the package can be analyzed.

As described herein, the monitoring method and system provide on-board reliability monitoring for cracking and crack detection or early life failure of 2D, 2.5D, or 3D flip-chip packages. Mechanical failures driven by chip/package CTE mismatch include, for example, die cracking, chip carrier cracking, underfill delamination (to the die and/or chip carrier), C4 fatigue, stacked via fails, package warpage, and the like. Each of these failure modes can be monitored using the instant system and method.

The monitoring method and system can be used in test vehicle development for early stress testing on package designs for the purposes of gathering data, in finished modules/production, or a combination thereof.

In general, the monitoring method first involves using a capacitive sensor to measure a baseline or initial condition at time zero (T0) for an undamaged package. The undamaged package will have a specific capacitance at each sensor site due to the bulk dielectric constant of the material between each capacitor pairs of the capacitive sensor and the spatial configuration of the geometries of the space between each capacitor pair. The capacitance is extracted by real-time monitoring of the sensors. The capacitance is measured for each sensor site, if there are multiple sensor sites, compensating for geometry and antenna effects, to create a time zero value for comparison with subsequent conditions. The electrical signal returning from the sensors at T0 can be described as S0, the signal at time zero.

The capacitance is measured from T0 until a first crack or non-critical failure is detected at time T1. The first crack occurs/propagates between the plates of the capacitive sensor, changing the geometry of the capacitor, the aggregate dielectric constant, and/or disrupting one of the plates of the capacitor, thus resulting in a measurement different from the T0 value. For example, an initial crack can occur, allowing air into underfill/interfill or underside of chip, thus changing the geometry of the capacitor, the bulk dielectric constant (before underfill/interfill, after underfill/interfill+air), and/or perhaps disrupting one of the plates of the capacitor pair. This causes the capacitive signature to shift. A signal for the first crack can be described as SN1, where N denotes an event. The usage of multiple sensors spatially localizes the initial fault before any electrical or functional failure occurs in the die or package. The first failure can be noted and the part can continue operation. The first failure signal (SN1) can optionally be used as a trigger to call for field repair. Additionally, once the first failure is detected, stress testing can be conducted for understanding failure propagation.

The part can continue operation and the capacitance continued to be measured for secondary (secondary failure signal SN2), tertiary (tertiary failure signal SN3), and subsequent cracks (x failure signal SNx) that are non-critical failures at times T2, T3, etc. up to time Tx. Continued monitoring of the capacitive signatures and spatial localization tracks the worsening of the initial crack and secondary cracking and effects. These events are noted and the propagation of failure is well understood without physical failure analysis.

At a catastrophic failure (final failure signal SF), at time TF is where the first electrical or mechanical failure of the package causes the device to cease operation due to primary or secondary cracks. For the stress/reliability study case, the difference in time and causality between primary, secondary non-critical failures, and catastrophic failures allows the construction of a much more powerful reliability model and understanding of the life span of the device. In a field use case, the catastrophic failure (final failure) would be avoided as the detection at first crack and reporting of the signal (SN1) would provide sufficient time for service of the package prior to complete fail.

The electrical signals returning from the capacitive sensor, from T0 (signal at time zero S0) to final failure (SF), with intermediate signals from subsequent cracks (SN1, SN2, etc., where N denotes an event) can be described as follows: S0→SN1→SN2→SNx→SF where S0≠SNx≠SF. The progression of SN1→SN2→SNx→SF describes the propagation of cracks in real time, and can benchmark solutions such as crack stops or other solutions.

The monitoring system (alternately referred to as the monitoring apparatus) comprises at least one capacitive sensor comprising a pair of capacitor plates separated by one or more materials of the chip package acting as the dielectric. There is no limitation to the number of capacitor plate pairs that can be used in the chip package. In alternative embodiments, the monitoring system comprises a group of capacitor pairs or an array of capacitor pairs, each containing 2 or more capacitor pairs. The capacitive sensors monitor for change in geometry or bulk dielectric constant which is due to either a crack leading to air gap or a change in geometry of the capacitor components.

In general, the construction of the monitoring system involves the placement of one or more capacitive sensors in or around areas of the chip package. The area of the chip package is non-limiting, although those areas under the highest mechanical stress caused by CTE mismatch are particularly targeted. Those areas of high mechanical stress include chip underfill, chip interfill, chip/interposer regions, and the like; and particularly corner regions.

The capacitive sensor can be an individual capacitor pair, a group of capacitor pairs, or an array of capacitor pairs, or a combination thereof. In a single chip package, there can be any number of capacitive sensors, from a capacitive sensor in a single area or location of the chip package, to multiple capacitive sensors in various locations of the chip package to monitor multiple areas simultaneously. There is no limitation to the number of capacitor pairs for each area. Alternative configurations include equispaced grids of capacitors, and non-equispaced grids (e.g. logarithmic) where more capacitor pairs are placed closer to the edges of a die and fewer are placed near the center of the die. Another alternative configuration is an outer ring of sensors monitoring the perimeter of the die, for example, where at least one capacitive sensor is a group of capacitor pairs located around the perimeter of a die. Other exemplary configurations include checkerboard and other non-100% coverage geometries to optimally detect where cracks are most likely to occur based on prior knowledge of package failure (intelligent placement of sensors).

The capacitor plates are made from an electrically conductive material such as a metal, a doped silicon, germanium, silicon germanium, a conducting metallic compound material and alloys thereof (e.g., tantalum nitride, titanium nitride, tungsten silicide, tungsten nitride, ruthenium oxide, cobalt silicide, nickel silicide), carbon nanotube, conductive carbon, or any suitable combination of these materials. Suitable metals include, for example, aluminum, cobalt, copper, copper alloy, gold, platinum, ruthenium, silver, tantalum, tin, titanium, tungsten, zirconium, and the like.

The placement of the capacitor plates is not limited to any specific configuration or location in the chip package as all design components can be evaluated. To be used as test site design feature, the capacitor plates are placed in one or more configurations that allow for detection in a change in capacitance, dielectric constant, or geometry of the capacitor.

Prior to or during assembly of the chip package, the capacitive sensors can be built into or included in the individual components of the chip package that are to be monitored. Thus, the capacitive sensors of the monitoring system can be integrated in the manufacturing process of the chip packages. In one example, a capacitive plate can be created or applied to the back side of a die and the corresponding capacitive plate (to make up the capacitor pair) can be embedded or placed atop the substrate or interposer that the die will be electrically connected to through C4 bumps or other suitable connection. In this example, the underfill or interfill between the pair of capacitor plates will be the dielectric. In another example, the capacitor plate can be located on the underfill/interfill fillet or on the vertical side of a die and a corresponding plate located in the underfill or interfill.

The capacitor plate pair of the capacitive sensor can have one capacitive plate connected for electrical readout (AC characterization) or both capacitive plates can be connected. Closed loop wiring between both capacitive plates of the capacitor pair enables AC and DC characterization, whereas open ended wiring requires AC characterization. In one example, wiring can be located on the substrate to electrically connect the capacitor plate embedded in the substrate, while the corresponding capacitor plate to complete the pair is grounded.

An electrical connection can be made from the capacitive sensor to an analog-to-digital converter to feed the measurements obtained from the capacitor. In turn the output from the A/D converter can be sent to a microprocessor located in the chip package or attached externally to the chip package. The microprocessor can conduct diagnostics, signal for a service call or part replacement, or conduct other action depending upon the signals received from the capacitive sensor.

The monitoring systems are now described in detail by exemplary embodiments of a 2D flip-chip package with accompanying figures. Like reference numerals refer to like elements across different embodiments. The figures are not to scale.

FIG. 1 is a close up, side view of a portion of a 2D flip-chip package showing exemplary primary crack propagation routes, including underfill sidewall delamination crack, bulk underfill crack, and underfill to chip delamination. A die (10) is connected to an organic laminate substrate (20) through C4 bumps (30) and underfill (40). A thermal interface material (TIM) (50) is located between the die (10) and lid (60). An underfill sidewall delamination crack (101) is shown running vertically between the die (10) and the underfill (40). A bulk underfill crack (102) is shown running through the underfill (40) to the organic laminate substrate (20). An underfill to chip delamination (103) is shown running horizontally between the die (10) and the underfill (40) which leads into C4 failure (104), breaking the electrical pathways and thereby causing module failure.

Figure 2:
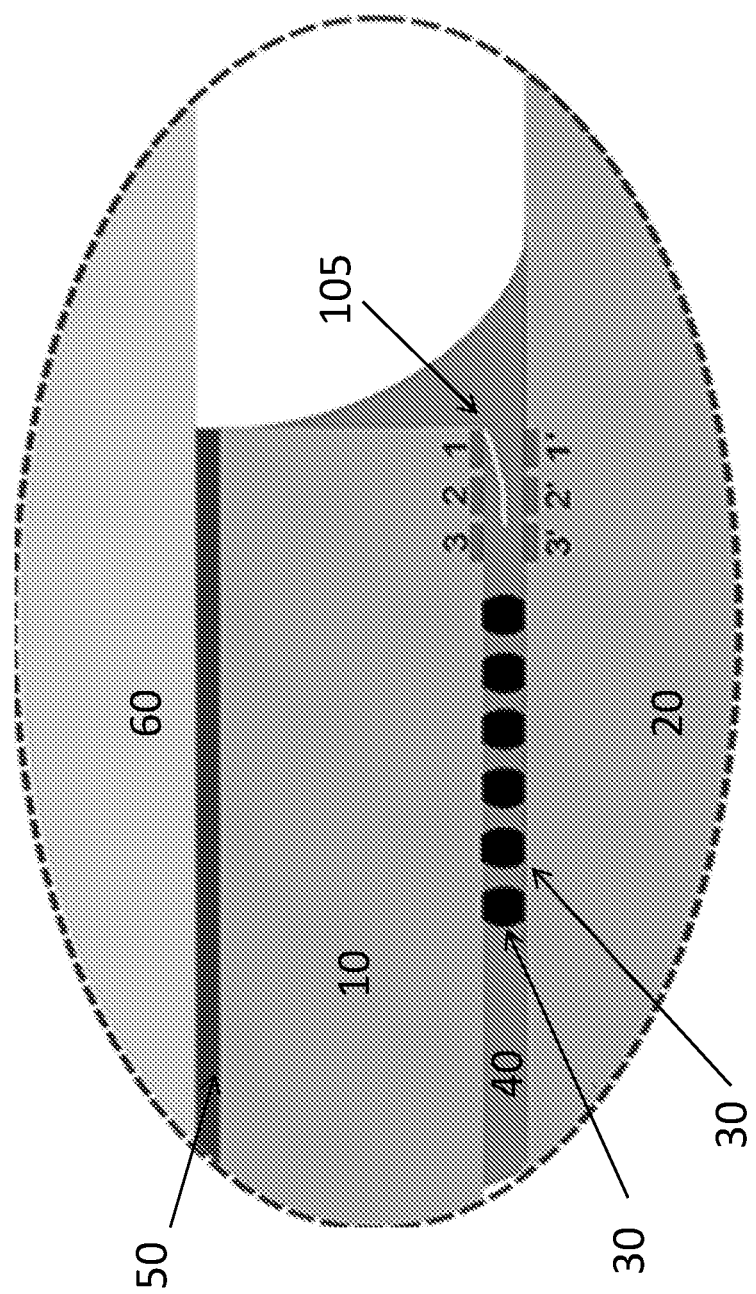
FIG. 2 is a schematic of a close up, side view of a portion of a 2D flip-chip package with capacitive sensors used to monitor crack propagation in chip underfill.

FIG. 2 is a close up, side view of a portion of a 2D flip-chip package with an exemplary capacitive sensor system to monitor crack propagation in chip underfill. A die (10) is connected to an organic laminate substrate (20)

through C4 bumps (30) and underfill (40). A thermal interface material (TIM) (50) is located between the die (10) and lid (60). Die capacitor plates (1, 2, 3) are located in the corner of the die (10) and the corresponding substrate capacitor plates (1', 2', 3') to complete the capacitor pairs are located in the organic laminate substrate (20). The underfill (40) functions as the dielectric between the capacitor pairs. The initiation and propagation of bulk underfill crack (105) can be monitored by the capacitive sensor via the die/substrate capacitor plate pairs (1-1', 2-2', 3-3'). Crack initiation at the die (10) corner can first be detected by the change in capacitance at capacitor pair 1-1'. Over time, as the initial crack propagates through the underfill (40), the crack will subsequently be detected by capacitor pair 2-2' and finally capacitor pair 3-3'.

Figure 3:
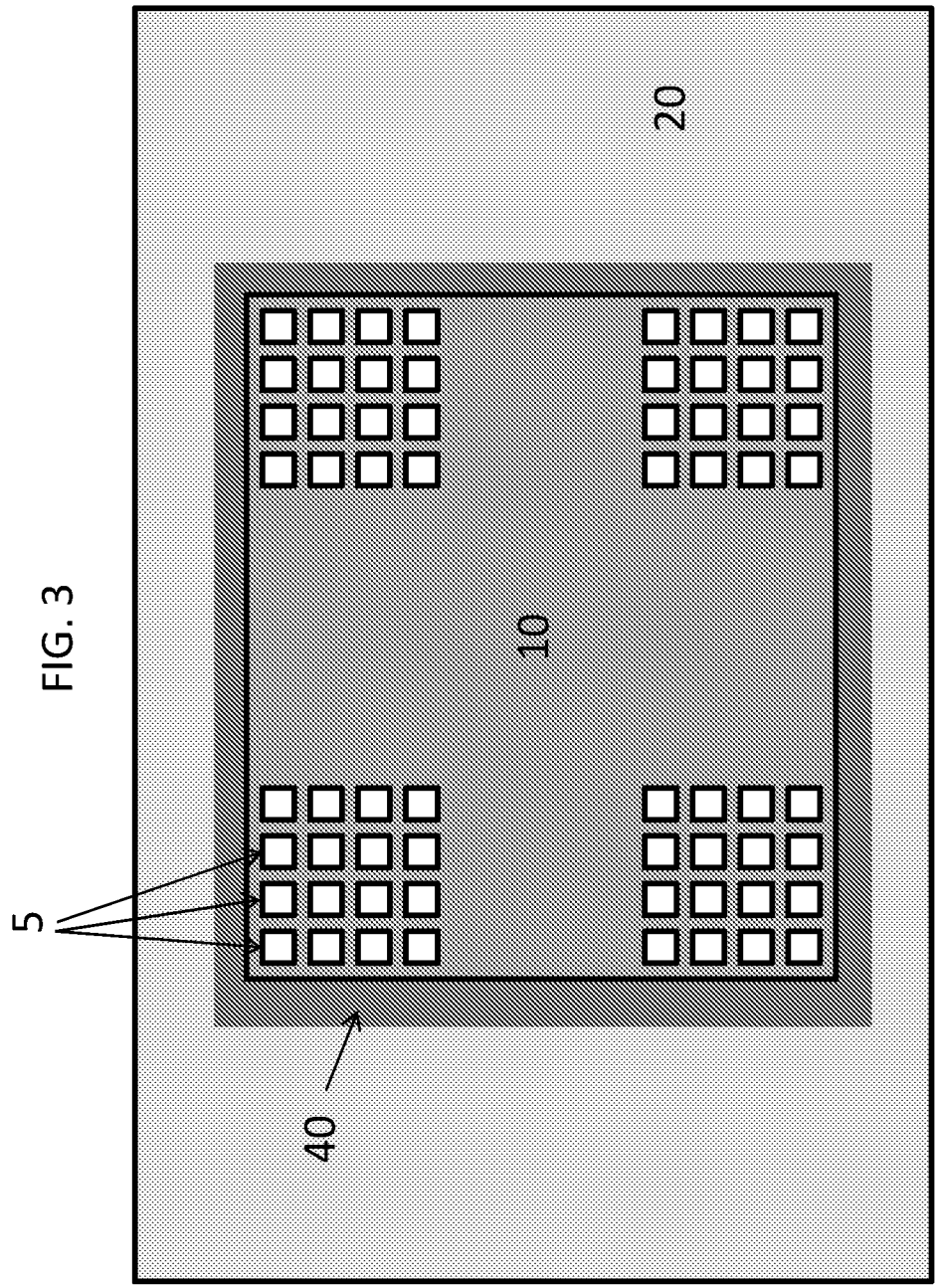
FIG. 3 is a schematic of a top down view of a portion of a 2D flip-chip package with capacitive sensors used to monitor crack propagation in chip underfill.

FIG. 3 is a top down view of a portion of a 2D flip-chip package with an exemplary capacitive sensor in the form of an array of capacitor pairs to monitor crack propagation in chip underfill. A die (10) is connected to an organic laminate substrate (20) through C4 bumps (not shown) and underfill (40). A 5×5 array of die capacitor plates (5) is located at each corner of the die (10). Below each array of die capacitor plates (5) is a corresponding array of substrate capacitor plates (not shown) located in the organic laminate substrate (20). The underfill (40) functions as the dielectric between the capacitor pairs. The initiation and propagation of bulk underfill cracks (not shown) can be monitored by the capacitive sensor via the die/substrate capacitor plate pairs.

Figure 4:
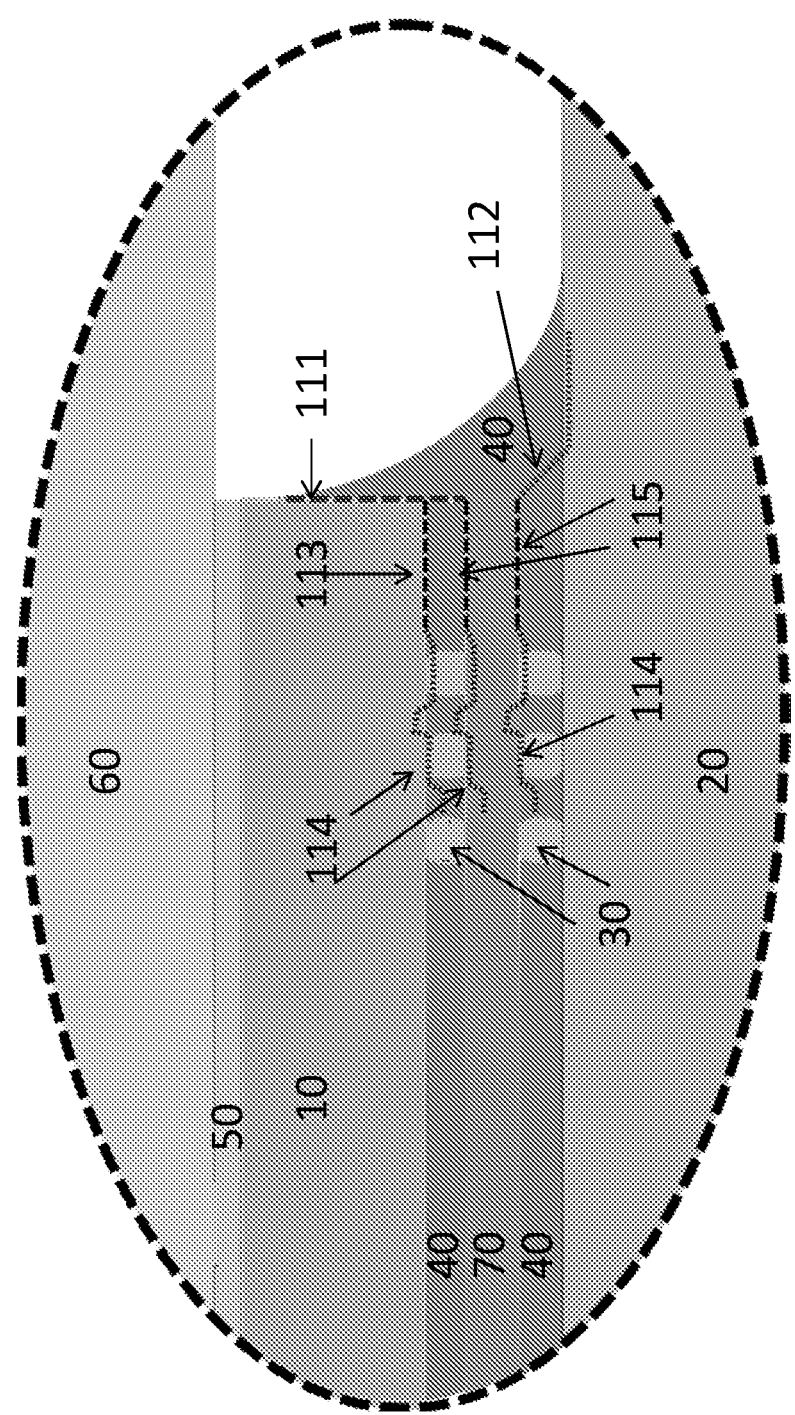
FIG. 4 is a schematic of a close up, side view of a portion of a 2.5D flip-chip package showing exemplary primary crack propagation routes.

FIG. 4 is a close up, side view of a portion of a 2.5D flip-chip package showing exemplary primary crack propagation routes, including underfill sidewall delamination crack at the die, bulk underfill crack, underfill to chip delamination, and underfill to interposer delamination. A die (10) is connected to an interposer (70) through C4 bumps (30) and underfill (40) and the interposer (70) is connected to an organic laminate substrate (20) through C4 bumps (30) and underfill (40). A thermal interface material (50) is located between the die (10) and lid (60). An underfill sidewall delamination crack (111) is shown running vertically between the die (10) and the underfill (40). A bulk underfill crack (112) is shown running through the underfill (40) to the organic laminate substrate (20). An underfill to chip delamination (113) is shown running horizontally between the die (10) and the underfill (40) which leads into C4 failure (114), breaking the electrical pathways and thereby causing module failure. An underfill to interposer delamination (115) is shown running horizontally between the interposer (70) and the underfill (40) which leads into C4 failure (114).

Figure 5:
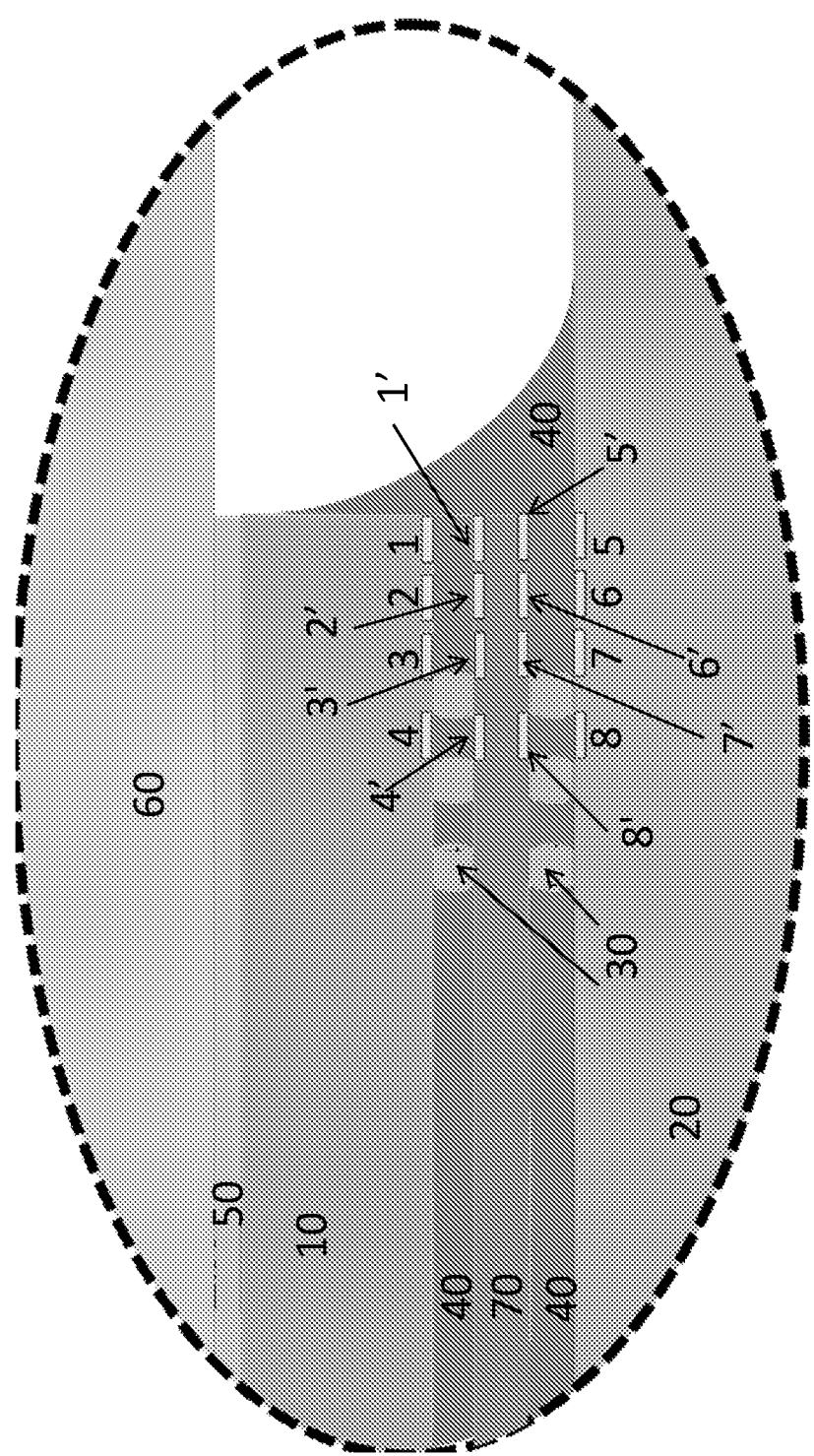
FIG. 5 a schematic of a close up, side view of a portion of a 2.5D flip-chip package with capacitive sensors used to monitor crack propagation in chip underfill.

FIG. 5 is a close up, side view of a portion of a 2.5D flip-chip package with exemplary capacitive sensor systems to monitor crack propagation in chip underfill. A die (10) is connected to an interposer (70) through C4 bumps (30) and underfill (40) and the interposer (70) is connected to an organic laminate substrate (20) through C4 bumps (30) and underfill (40). A thermal interface material (50) is located between the die (10) and lid (60). Die capacitor plates (1, 2, 3,4) are located in the corner of the die (10) and the corresponding interposer capacitor plates (1', 2', 3',4') to complete the capacitor pairs are located on the interposer (70). The underfill (40) functions as the dielectric between the capacitor pairs. The initiation and propagation of underfill cracks (not shown in the figure) can be monitored by the capacitive sensor via the die/interposer pairs (1-1', 2-2', 3-3',4-4'). Crack initiation at the die (10) corner can first be detected by the change in capacitance at capacitor pair 1-1'. For example over time as an initial corner crack propagates through the underfill (40), the crack will subsequently be detected by capacitor pair 2-2', then capacitor pair 3-3', and finally capacitor pair 4-4'. In addition, substrate capacitor plates (5, 6, 7, 8) are located in the organic laminate substrate (20) and the corresponding interposer capacitor plates (5', 6', 7', 8') to complete the capacitor pairs are located at the corner of the interposer (70). The underfill (40) functions as the dielectric between the capacitor pairs. The initiation and propagation of underfill cracks (not shown in the figure) such as bulk underfill cracks or underfill to interposer delamination can be monitored by the capacitive sensor via the substrate/interposer pairs (5-5', 6-6', 7-7', 8-8').

Figure 6:
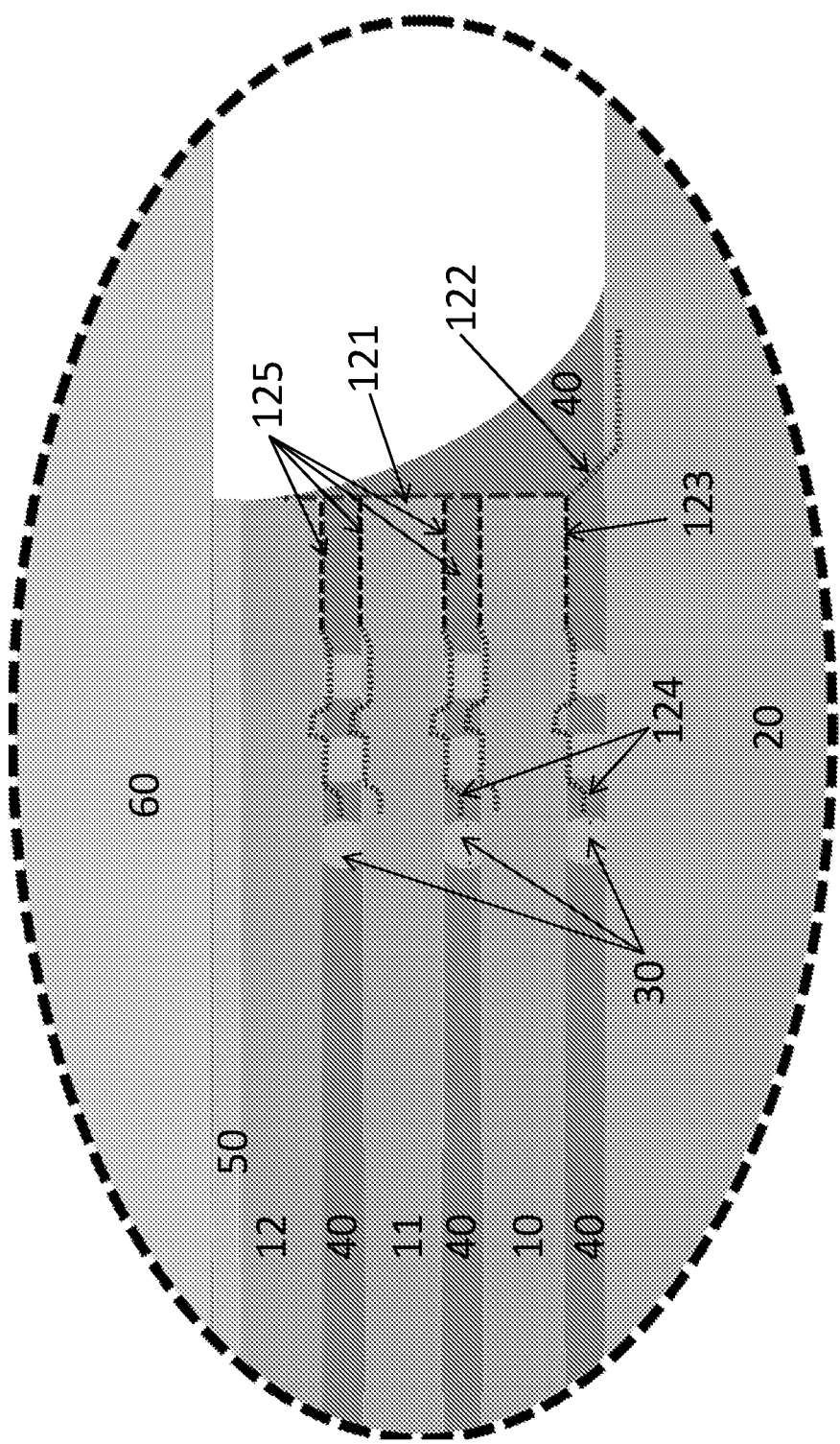
FIG. 6 is a schematic of a close up, side view of a portion of a 3D flip-chip package showing exemplary primary crack propagation routes.

FIG. 6 is a close up, side view of a portion of a 3D flip-chip package showing exemplary primary crack propagation routes, including underfill sidewall delamination crack at the dies, bulk underfill crack, and underfill to chip delaminations. A stack of dies (10, 11, 12) are connected to each other through C4 bumps (30) and underfill (40) and die (10) is connected to an organic laminate substrate (20) through C4 bumps (30) and underfill (40). A thermal interface material (50) is located between die (12) and lid (60). An underfill sidewall delamination crack (121) is shown running vertically along the dies (10, 11, 12) and the underfill (40). A bulk underfill crack (122) is shown running through the underfill (40) to the organic laminate substrate (20). An underfill to chip delamination (123) is shown running horizontally between the die (10) and the underfill (40) which leads into C4 failure (124), breaking the electrical pathways and thereby causing module failure. Various underfill to die delaminations (125) within the die stack are shown running horizontally between the dies (10, 11, 12) and the underfill (40) which leads into C4 failure (124).

Figure 7:
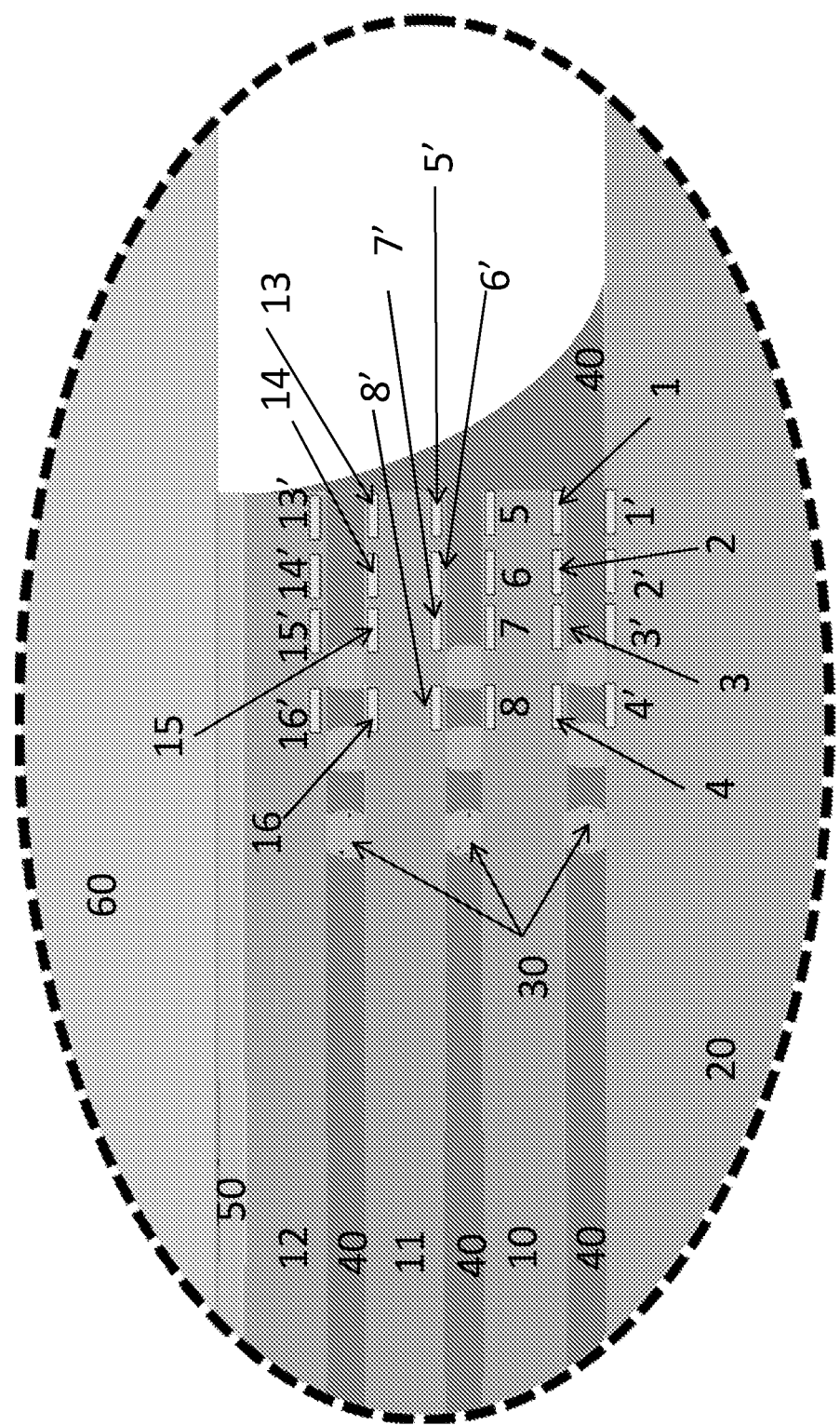
FIG. 7 a schematic of a close up, side view of a portion of a 3D flip-chip package with capacitive sensors used to monitor crack propagation in chip underfill.

FIG. 7 is a close up, side view of a portion of a 3D flip-chip package with exemplary capacitive sensor systems to monitor crack propagation in chip underfill. A stack of dies (10, 11, 12) are connected to each other through C4 bumps (30) and underfill (40) and die (10) is connected to an organic laminate substrate (20) through C4 bumps (30) and underfill (40). A thermal interface material (50) is located between die (12) and lid (60). Die capacitor plates (1, 2, 3, 4) are located in the corner of the die (10) and the corresponding substrate capacitor plates (1', 2', 3', 4') to complete the capacitor pairs are located on the organic laminate substrate (20). The underfill (40) functions as the dielectric between the capacitor pairs. The initiation and propagation of underfill cracks (not shown in the figure) can be monitored by the capacitive sensor via the die/substrate pairs (1-1', 2-2', 3-3', 4-4'). In addition, die capacitor plates (5, 6, 7, 8) are located in the die (10) and the corresponding die capacitor plates (5', 6', 7', 8') to complete the capacitor pairs are located in the die (11). The underfill (40) functions as the dielectric between the capacitor pairs. The initiation and propagation of underfill cracks (not shown in the figure) can be monitored by the capacitive sensor via the die/die pairs (5-5', 6-6', 7-7', 8-8'). Still further, die capacitor plates (13, 14, 15, 16) are located in the die (11) and the corresponding die capacitor plates (13', 14', 15', 16') to complete the capacitor pairs are located in the die (12). The underfill (40) functions as the dielectric between the capacitor pairs. The initiation and propagation of underfill cracks (not shown in the figure) can be monitored by the capacitive sensor via the die/die pairs (13-13', 14-14', 15-15', 16-16').

In one embodiment, individual, groups, or arrays of capacitor plate pairs are placed in and around stressed areas of the chip underfill or interfill of a chip package. Within this embodiment, the capacitor plates are placed in chip corner regions as well as the corresponding organic laminate substrate or interposer region connected through C4 bumps. The capacitive sensors monitor and detect any crack initiating and migrating in the underfill or interfill layer towards the C4 via tracking the change in capacitance due to presence of a mechanical flaw (air gap) or change in geometry.

Figure 8:
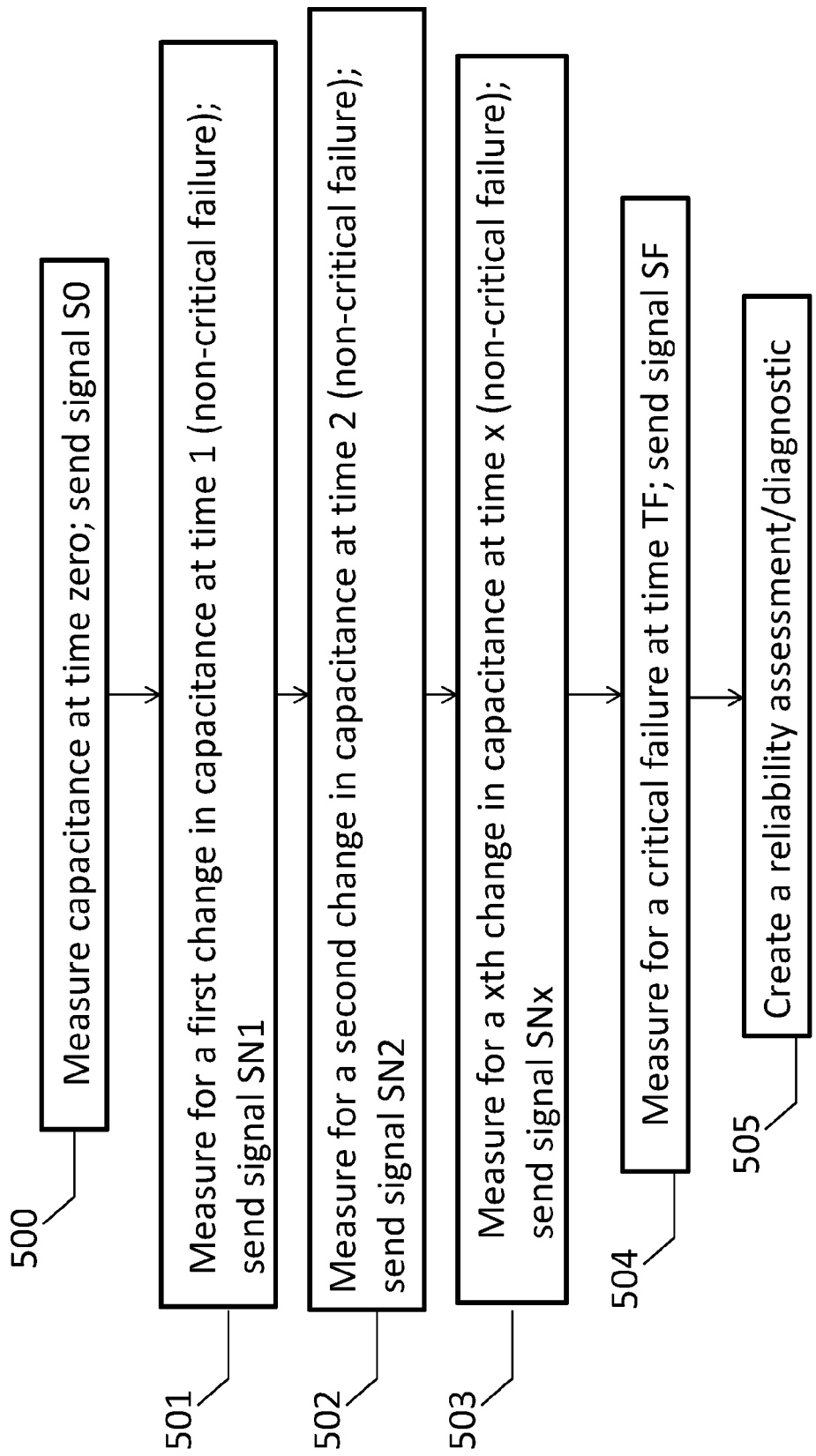
FIG. 8 is a flow chart of an exemplary process for monitoring a flip-chip package reliability.

FIG. 8 is a flow chart of an exemplary process for monitoring the reliability of a flip-chip package comprising the capacitive sensor structure. Within this example, a capacitive sensor is located in a flip-chip package (e.g. at a die corner, with die capacitor plates and substrate capacitor plates, with the underfill functioning as the dielectric). In a first step (500), the capacitive sensor measures an initial capacitance at time zero (T0) to create signal zero (S0) as a baseline measurement. The capacitance at the capacitive sensor is monitored until a first change in capacitance is measured at time 1 (T1) corresponding to a non-critical failure. An electrical signal for the first change in capacitance (SN1), that is the first failure, is sent (501). In a next step, the capacitance at the capacitive sensor is monitored until a second change in capacitance is measured at time 2 (T2) corresponding to a second non-critical failure. An electrical signal for the second change in capacitance (SN2), that is the second failure, is sent (502). In a next step, the capacitance at the capacitive sensor is monitored until another change in capacitance is measured at time x (Tx) corresponding to an additional non-critical failure. An electrical signal for the change in capacitance (SNx), that is the xth noncritical failure, is sent (503). At the time of critical failure (TF) an electrical signal is sent for the final failure (SF) (504). The sequential inventory of non-critical failures and critical failure is then used to create a reliability assessment or diagnostic for the flip-chip package (505).

The instant system and method are not solely limited to planar packaging solutions (2D) as described in FIG. 2 and FIG. 3, but can be generalized to 2.5D and 3D package types with one or more die, stacked die, die on interposers, etc.

The monitoring method and system using the capacitive sensors provide real-time first cause capability via non-destructive testing, unlike current monitoring methods. The method and system can be used to monitor 2D, 2.5D, and 3D chip-packaging interaction crack propagation (underfills, interfills, solder masks, chip, substrate, interposer, etc.), delamination, and warping. The method provides reconstruction of the failure sequence rather than a simple "pass/catastrophic fail".

The advantages of using the monitoring method and system include cost savings as fewer parts would be needed for stress test qualification since more information can be obtained from the same amount of parts. There is also increased field reliability with the opportunity for service before catastrophic fail of the chip package. The method and system are a significant improvement over CSAM Microscopy and Opens-Shorts/Signal Net Approaches, each of which requires catastrophic failure, are not in real-time, and cannot provide information as to "first cause" failure.

The monitoring method and system described herein find particular application in those fields requiring ultra-high reliability specifications, including the military, financial institutions, medical applications, as well as certain industrial and avionic applications.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A monitoring apparatus, comprising:
a pair of capacitive sensors that measure capacitance between the pair of capacitive sensors, the pair of capacitive sensors located in a flip-chip package, wherein the flip-chip package comprises a die bonded to a substrate using a bump between the die and the substrate, and wherein a first sensor of the pair of capacitive sensors is formed on a surface of the die and a second sensor of the pair of capacitive sensors is formed opposite the first sensor on a surface of the substrate;
wherein the monitoring apparatus can sense a change in capacitance between the first sensor and the second sensor, and, in response, report a chip-packaging interaction failure.

2. The monitoring apparatus of claim 1, wherein the chip-packaging interaction failure is:
crack formation and propagation in the flip-chip package underfill, interfill, solder mask, chip, substrate, interposer, or a combination thereof; or
delamination of a component of the flip-chip package; or
warping of the flip-chip package; or
a combination thereof.

3. The monitoring apparatus of claim 1 further comprising a second pair of capacitive sensors, and wherein the pair of capacitive sensors and the second pair of capacitive sensors comprise a group of capacitor pairs or an array of capacitor pairs.

4. The monitoring apparatus of claim 1, wherein the pair of capacitive sensors is located in a die-corner region, between a die and a substrate, between a die and an interposer, between two dies, or a combination thereof.

5. The monitoring apparatus of claim 1, wherein the pair of capacitive sensors comprises a pair of capacitor plates electrically connected to an A/D converter, which in turn is electrically connected to a microprocessor.

6. The monitoring apparatus of claim 5, wherein the microprocessor can call for a field repair or stress testing after receiving an electrical signal of a change in capacitance from the pair of capacitive sensors.

7. The monitoring apparatus of claim 1, wherein the monitoring apparatus can detect and track the initiation and propagation of chip-packaging interaction induced cracking and delamination within the package.

8. The monitoring apparatus of claim 1, wherein the pair of capacitive sensors is a group of capacitor pairs in the form of:
an equispaced grid;
a non-equispaced grid where more capacitor pairs are placed closer to an edge of a die and fewer are placed near the center; or
a checkerboard geometry.

9. The monitoring apparatus of claim 1, wherein the pair of capacitive sensors is a group of capacitor pairs located around the perimeter of a die.

* * * * *